(12) United States Patent
Marent et al.

(10) Patent No.: US 9,424,925 B2
(45) Date of Patent: Aug. 23, 2016

(54) MEMORY CELL

(75) Inventors: Andreas Marent, Berlin (DE); Dieter Bimberg, Berlin (DE)

(73) Assignee: Technische Universität Berlin, Berlin (DE)

( * ) Notice: Subject to any disclaimer, the term of this patent is extended or adjusted under 35 U.S.C. 154(b) by 297 days.

(21) Appl. No.: 14/009,620

(22) PCT Filed: Mar. 29, 2012

(86) PCT No.: PCT/DE2012/200019
§ 371 (c)(1),
(2), (4) Date: Feb. 6, 2015

(87) PCT Pub. No.: WO2012/136206
PCT Pub. Date: Oct. 11, 2012

(65) Prior Publication Data
US 2015/0310919 A1    Oct. 29, 2015

(30) Foreign Application Priority Data

Apr. 5, 2011  (DE) .......................... 10 2011 006 782

(51) Int. Cl.
| | |
|---|---|
| *G11C 16/16* | (2006.01) |
| *G11C 16/04* | (2006.01) |
| *B82Y 10/00* | (2011.01) |
| *H01L 29/80* | (2006.01) |
| *G11C 16/14* | (2006.01) |

(Continued)

(52) U.S. Cl.
CPC ............ *G11C 16/0466* (2013.01); *B82Y 10/00* (2013.01); *G11C 16/0408* (2013.01); *G11C 16/14* (2013.01); *G11C 16/26* (2013.01); *H01L 29/803* (2014.09); *H01L 29/788* (2013.01)

(58) Field of Classification Search
USPC .......................................... 365/158, 171, 173
See application file for complete search history.

(56) References Cited

U.S. PATENT DOCUMENTS

| | | | |
|---|---|---|---|
| 4,103,312 | A | 7/1978 | Chang et al. |
| 5,147,817 | A | 9/1992 | Frazier et al. |
| 5,923,046 | A | 7/1999 | Tezuka et al. |

(Continued)

FOREIGN PATENT DOCUMENTS

| | | |
|---|---|---|
| DE | 10 2006 59 110 A1 | 6/2008 |
| EP | 1 523 012 | 4/2005 |

OTHER PUBLICATIONS

A. Marent, M. Geller, A. Schliwa, D. Feise, K. Pötschke, D. Bimberg, N. Akcay, and N. Oncan; 106 years extrapolated hole storage time in GaSb/AlAs quantum dots, Appl. Phys. Lett. 91(24), 242109 (2007); 4 pages.

(Continued)

*Primary Examiner* — Hoai V Ho
*Assistant Examiner* — Minh Dinh
(74) *Attorney, Agent, or Firm* — Gordon & Rees LLP

(57) ABSTRACT

The invention relates, inter alia, to a memory cell (10) comprising at least one binary memory area for storing bit information.

Figure 1:
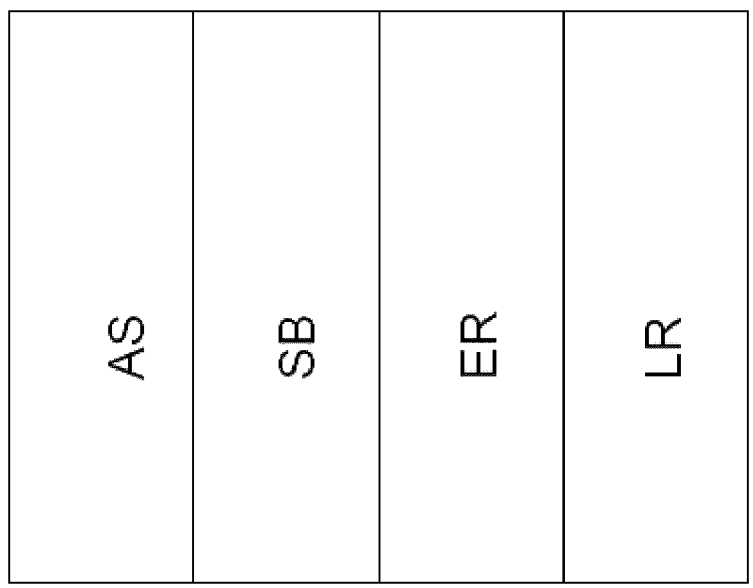

According to the invention it is provided that the memory area (SB) can optionally store holes or electrons and allows a recombination of holes and electrons, the charge carrier type of the charge carriers stored in the memory area defines the bit information of the memory area, and a charge carrier injection device (PN) is present, by means of which optionally holes or electrons can be injected into the memory area (SB) and the bit information can thus be changed.

9 Claims, 8 Drawing Sheets

(51) Int. Cl.
*G11C 16/26* (2006.01)
*H01L 29/788* (2006.01)

(56) References Cited

U.S. PATENT DOCUMENTS

| | | | |
|---|---|---|---|
| 6,720,589 | B1 | 4/2004 | Shields |
| 7,948,822 | B2 * | 5/2011 | Bimberg ............... B82Y 10/00 365/164 |
| 8,686,513 | B1 * | 4/2014 | Seok ................. H01L 29/4238 257/379 |
| 2008/0137407 | A1 * | 6/2008 | Wu ........................ G11C 16/10 365/174 |
| 2009/0086549 | A1 | 4/2009 | Fujiki |
| 2009/0213662 | A1 | 8/2009 | Leburton et al. |

OTHER PUBLICATIONS

B. Marquardt, M. Geller, A. Lorke, D. Reuter, and A. D. Wieck; Using a two-dimensional electron gas to study nonequilibrium tunneling dynamics and charge storage in selfassembled quantum dots, Appl. Phys. Lett. 95(2), 022113 (2009); 4 pages.

D. Bimberg; Semiconductor NanostrUctures, Springer-Verlag, Berlin Heidelberg, 2008, pp. 1-357.

Geller M. et al.; Tunneling emission from self-organized In(Ga)As/GaAs quantum dots observed via time-resolved capacitance measurements, Physical Review, B. Condensed Matter, American Institute of Physics., New York, US, vol. 73, No. 20, May 15, 2006, pp. 205331-1 to 205331-8.

International Preliminary Report on Patentability; PCT/DE2012/200019; Oct. 17, 2013; 13 pages.

International Technology Roadmap for Semiconductors, Emerging Research Devices, Technical report, Edition 2009; 61 pages.

M. Feucker, R. Seguin, S. Rodt, A. Hoffmann, and D. Bimberg; Decay dynamics of neutral and charged excitonic complexes in single InAs/GaAs quantum dots, Appl. Phys. Lett. 92(6), 063116 (2008), 4 pages.

M. Geller, A. Marent, E. Stock, D. Bimberg, V. I. Zubkov, I. S. Shulgunova, and A. V. Solomonov; Hole capture into self-organized InGaAs quantum dots, Appl. Phys. Lett. 89(23), 232105 (2006); 4 pages.

M. Geller, A. Marent, T. Nowozin, D. Bimberg, N. Akcay, and N. Oncan; A write time of 6 ns for quan-tum dot-based memory structures, Appl. Phys. Lett. 92(9), 2008, pp. 092108-1 to 092108-03.

M. Russ, C. Meier, A. Lorke, D. Reuter, and A. D. Wieck; Role of quantum capacitance in coupled low-dimensional electron systems, Phys. Rev. B 73(11), pp. 115334-1 to 115334-6 (2006).

P. Pavan, R. Bez, P. Olivo, and E. Zanoni: Flash memory cells—An overview, Proc. IEEE 85(8), pp. 1248-1271 (1997).

R. Waser; Nanoelectronics and Information Technology, Wiley-VCH, Berlin, 2003; 14 pages.

\* cited by examiner

MEMORY CELL

The invention relates to a memory cell comprising the features in accordance with the preamble of patent claim 1.

The most important semiconductor memories commercially are nowadays "volatile" DRAM memories and "nonvolatile" flash memories [1][2][3].

DRAM memories, which are employed for example as main memories in personal computers, store information as charge in a capacitor. The advantages of the DRAM memory reside in a fast access time in the range of below 10 nanoseconds and a high durability of $>10^{16}$ write and erase cycles. The crucial disadvantage is a short storage time of a few tens of milliseconds. The write and erase voltage is approximately 2.5 V.

In the case of the flash memory, which is used e.g. in memory sticks, digital cameras or cell phones, a MOSFET structure having a so-called "floating gate" is used as memory element. By using $SiO_2$ barriers within which the charge is stored, the flash memory is able to achieve storage times of more than 10 years. The disadvantage of the $SiO_2$ barriers consists in a very slow write time of the order of magnitude of microseconds and low durability of only about one million erase and write cycles. Furthermore, the write and erase voltages are more than 12 V, which leads to a high power consumption of the memory cell. The write process in the case of the flash memory is effected by means of the injection of "hot" charge carriers, which are brought into the "floating gate" via one of the two $SiO_2$ barriers by a high voltage being applied.

However, owing to their high kinetic energy, the hot charge carriers destroy the barrier little by little and—owing to the height of the barrier to be overcome—pass into the "floating gate" only with low probability, as a result of which the write process is slowed down.

To summarize, therefore, the memories known from the prior art can be classified in two classes, namely volatile and nonvolatile memories. The volatile memories have short storage times and short write and erase times, while the nonvolatile memories have long storage times, but also long write and erase times. Hitherto, long storage times and short write and erase times have thus been mutually exclusive.

The invention addresses the problem of specifying a memory cell which, on the basis of its construction, enables a relatively long storage time and relatively fast write and erase processes.

This problem is solved according to the invention by means of a memory cell comprising the features as claimed in patent claim 1. Advantageous configurations of the memory cell according to the invention are specified in dependent claims.

Accordingly, the invention provides a memory cell comprising at least one binary memory area for storing bit information, wherein the memory area can optionally store holes or electrons and allows a recombination of holes and electrons, the charge carrier type of the charge carriers stored in the memory area defines the bit information of the memory area, and a charge carrier injection device is present, by means of which optionally holes or electrons can be injected into the memory area and the bit information can thus be changed.

An essential advantage of the memory cell according to the invention is that the latter enables unipolar charge carrier injection and that the latter enables fast writing and erasing in the range of nanoseconds through the use of charge carrier recombination, and the write and erase times are independent of the storage time.

A further essential advantage of the memory cell according to the invention is that the latter—likewise owing to the charge carrier recombination—can manage with write and erase voltages of two volts or less. Low write and erase voltages advantageously avoid defects in the barriers and crucially increase the durability of the memory cell. Moreover, the power consumption of the memory cell is low with low write and erase voltages.

It is regarded as advantageous if the memory cell is configured in such a way that the stored bit information is changed by virtue of the fact that in the case where holes are stored in the memory area, electrons are injected, which recombine with the stored holes, and the bit information is overwritten with excess electrons, and in the case where electrons are stored in the memory area, holes are injected, which recombine with the stored electrons, and the bit information is changed with excess holes. The holes or electrons are preferably injected by external voltages being applied to the memory cell.

It is regarded as advantageous if the memory cell is configured in such a way that the stored bit information is changed by virtue of the fact that in the case where holes are stored in the memory area, electrons are injected by virtue of the fact that between a source contact and a drain contact of the memory cell, on the one hand, and the base contact of the memory cell, on the other hand, for writing purposes a write voltage in the forward direction of at least the magnitude of a diffusion voltage is applied, which leads to the complete reduction of a band bending (situated between the memory area and the charge carrier injection device) and thus of the trapping barrier for the electrons, such that the electrons relax directly from the band edge into the memory area and recombine there with the stored holes and the bit information is overwritten with excess electrons, and in the case where electrons are stored in the memory area, between the base contact and the rear contact an erase voltage in the forward direction of at least the magnitude of the diffusion voltage is applied, which leads to the reduction of the p-n space charge zone and holes are thus injected, which diffuse and/or drift from a hole reservoir of the charge carrier injection device into an n-doped region of the charge carrier injection device and further into the memory area in order to recombine there with the stored electrons, and the bit information is changed with excess holes.

Alternatively, the arrangement of the charge carrier injection device can also be reversed. In this case, the memory cell is preferably configured in such a way that the stored bit information is changed by virtue of the fact that in the case where holes are stored in the memory area, between the base contact and the rear contact an erase voltage in the forward direction of at least the magnitude of the diffusion voltage is applied, which leads to the reduction of the p-n space charge zone and electrons are thus injected, which diffuse and/or drift from a electron reservoir of the charge carrier injection device into a p-doped region of the charge carrier injection device and further into the memory area in order to recombine there with the stored holes, and the bit information is changed with excess electrons, and in the case where electrons are stored in the memory area, holes are injected by virtue of the fact that between a source contact and a drain contact of the memory cell, on the one hand, and the base contact of the memory cell, on the other hand, for writing purposes a write voltage in the forward direction of at least the magnitude of a diffusion voltage is applied, which leads to the reduction of a band bending (situated between the memory area and the charge carrier injection device) and thus of the trapping barrier for the holes, such that the holes relax directly from the band edge into the memory area and recombine there with the stored electrons and the bit information is overwritten with excess holes.

It is regarded as particularly advantageous if the charge carrier injection device indirectly or directly adjoins one side of the memory area, and a read-out device is arranged at the opposite other side, by means of which read-out device the charge carrier type stored in the memory area can be read out.

In order to spatially concentrate the quantity of charge for storing the bit information and to achieve long storage times, it is regarded as advantageous if the memory area comprises a double heterostructure. Preferably, this can be a strained double heterostructure, which leads to the formation of self-assembled quantum dots or quantum rings.

Preferably, the charge carrier injection device has a p-doped section and an n-doped section, which indirectly or directly adjoin the same side of the double heterostructure, such that, depending on external electrical driving, the n-doped section can inject electrons or the p-doped section can inject holes from the same side into the double heterostructure.

It is regarded as advantageous, moreover, if a read-out device having an electrically conductive section is present, the conductivity of said section depending on the charge carrier type stored in the memory area. This enables the bit information to be read out (without the stored bit information being altered) for example by a resistance or conductivity measurement of the resistance or of the conductivity of the electrically conductive section.

The read-out device preferably comprises a two-dimensional hole gas layer or a two-dimensional electron gas layer as the electrically conductive section.

In order to achieve short erase and write times, it is regarded as advantageous, moreover, if the memory area has a direct band transition which enables a radiative recombination of electrons and holes during the overwriting of the bit information in the memory area.

In accordance with a first particularly preferred embodiment variant, it is provided that the memory area comprises undoped semiconductor material, on one side of the memory area there is adjacent an n-doped semiconductor material followed by a p-doped semiconductor material, and on the other side of the memory area there is adjacent a read-out layer in the form of a two-dimensional hole gas layer.

In accordance with a second particularly preferred embodiment variant, it is provided that the memory area comprises undoped semiconductor material, on one side of the memory area there is adjacent a p-doped semiconductor material followed by an n-doped semiconductor material, and on the other side of the memory area there is adjacent a read-out layer in the form of a two-dimensional electron gas layer.

The invention furthermore relates to a method for storing bit information in a binary memory area.

According to the invention, it is provided in this regard that holes or electrons are stored in the memory area depending on the bit information to be stored, wherein the charge carrier type of the charge carriers stored in the memory area defines the bit information of the memory cell, and in order to change the bit information respectively stored, the charge carriers stored in the memory area are removed by virtue of the fact that complementary charge carriers are injected, which recombine with the stored charge carriers, and the new bit information is brought about by further complementary charge carriers being stored in the memory area.

With regard to the advantages of the method according to the invention, reference should be made to the above-explained advantages of the memory cell according to the invention, since the advantages of the memory cell according to the invention substantially correspond to those of the method according to the invention.

In the case of the method, it is regarded as particularly advantageous if the charge carriers are injected at one side of the memory area, and the bit information stored in the memory area is read out—preferably by a resistance or conductivity measurement—at the opposite other side.

Preferably, the stored bit information is changed by virtue of the fact that in the case where holes are stored in the memory area, electrons are injected by virtue of the fact that between a source contact and a drain contact of the memory cell, on the one hand, and the base contact of the memory cell, on the other hand, for writing purposes a write voltage in the forward direction of at least the magnitude of a diffusion voltage is applied, which leads to the reduction of a band bending (situated between the memory area and the charge carrier injection device) and thus of the trapping barrier for the electrons, such that the electrons relax directly from the band edge into the memory area and recombine there with the stored holes and the bit information is overwritten with excess electrons, and in the case where electrons are stored in the memory area, between the base contact and the rear contact an erase voltage in the forward direction of at least the magnitude of the diffusion voltage is applied, which leads to the reduction of the p-n space charge zone and holes are thus injected, which diffuse and/or drift from a hole reservoir of the charge carrier injection device into an n-doped region of the charge carrier injection device and further into the memory area in order to recombine there with the stored electrons, and the bit information is changed with excess holes.

Alternatively, the stored bit information can be changed by virtue of the fact that in the case where holes are stored in the memory area, between the base contact and the rear contact an erase voltage in the forward direction of at least the magnitude of the diffusion voltage is applied, which leads to the reduction of the p-n space charge zone and electrons are thus injected, which diffuse and/or drift from an electron reservoir of the charge carrier injection device into a p-doped region of the charge carrier injection device and further into the memory area in order to recombine there with the stored holes, and the bit information is changed with excess electrons, and in the case where electrons are stored in the memory area, holes are injected by virtue of the fact that between a source contact and a drain contact of the memory cell, on the one hand, and the base contact of the memory cell, on the other hand, for writing purposes a write voltage in the forward direction of at least the magnitude of a diffusion voltage is applied, which leads to the reduction of a band bending (situated between the memory area and the charge carrier injection device) and thus of the trapping barrier for the holes, such that the holes relax directly from the band edge into the memory area and recombine there with the stored electrons and the bit information is overwritten with excess holes.

Figure 2:
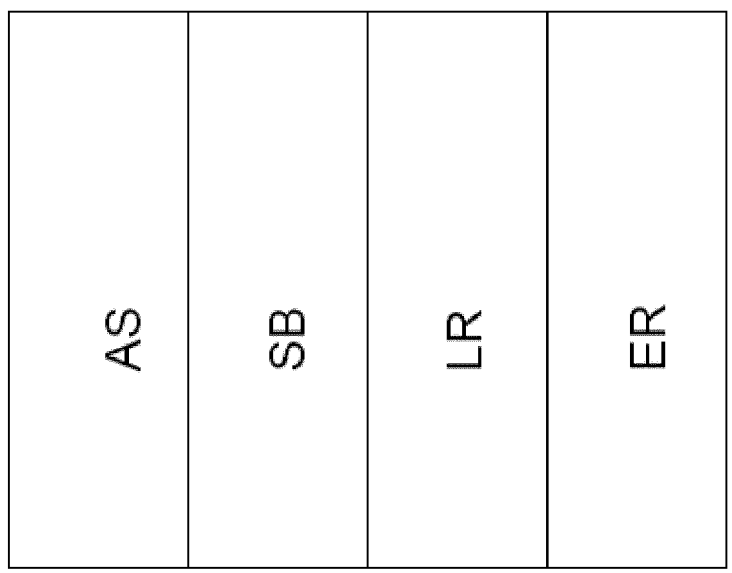
Figure 3:
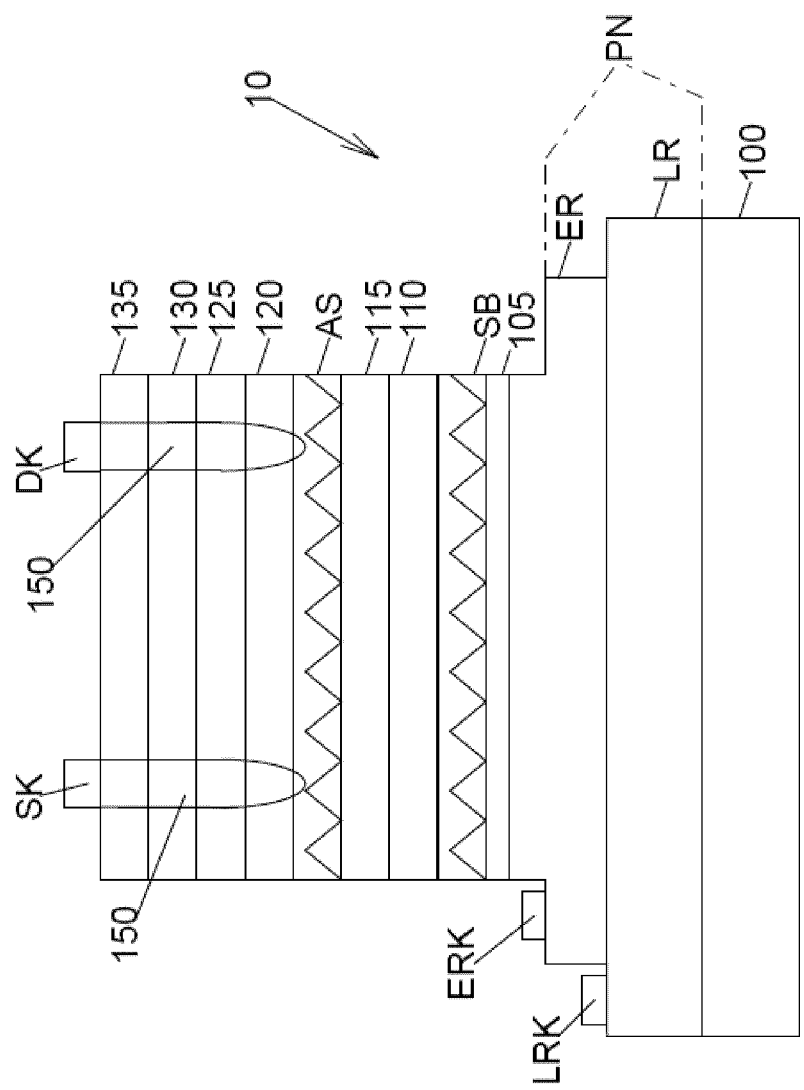
Figure 4:
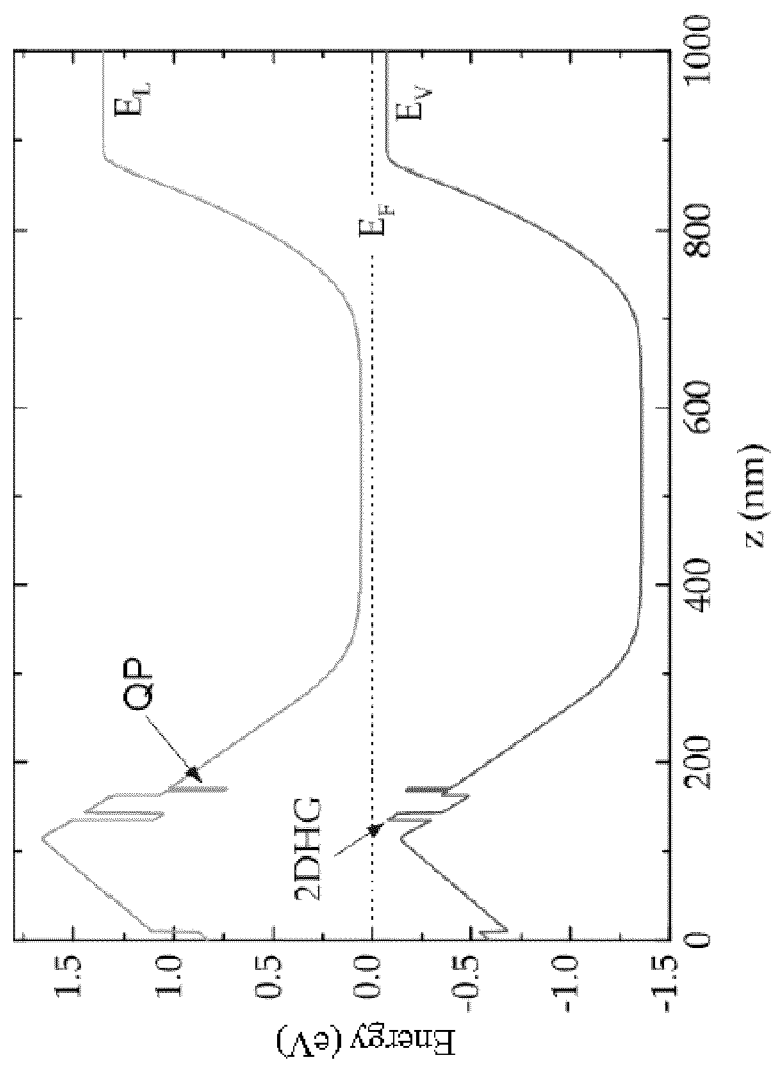
Figure 6:
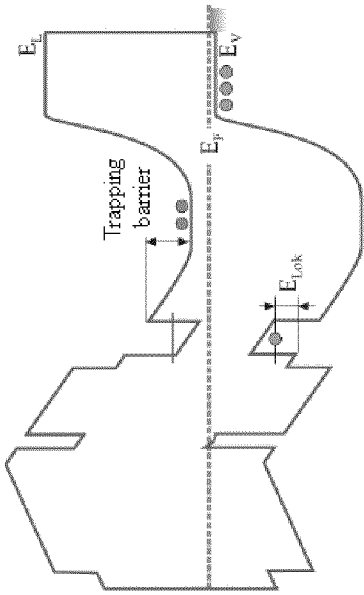
Figure 5:
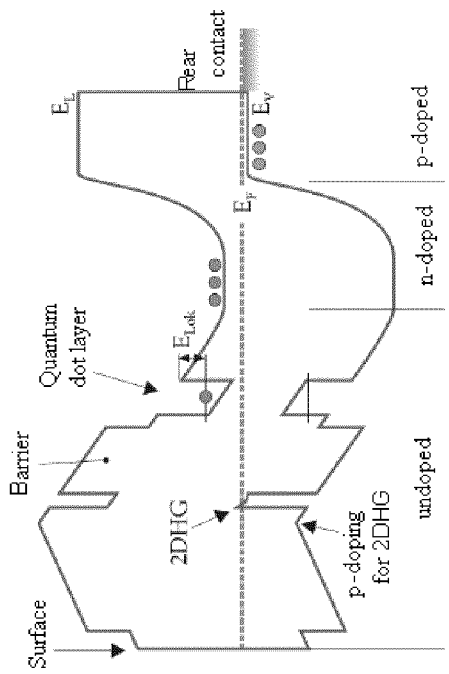
Figure 8:
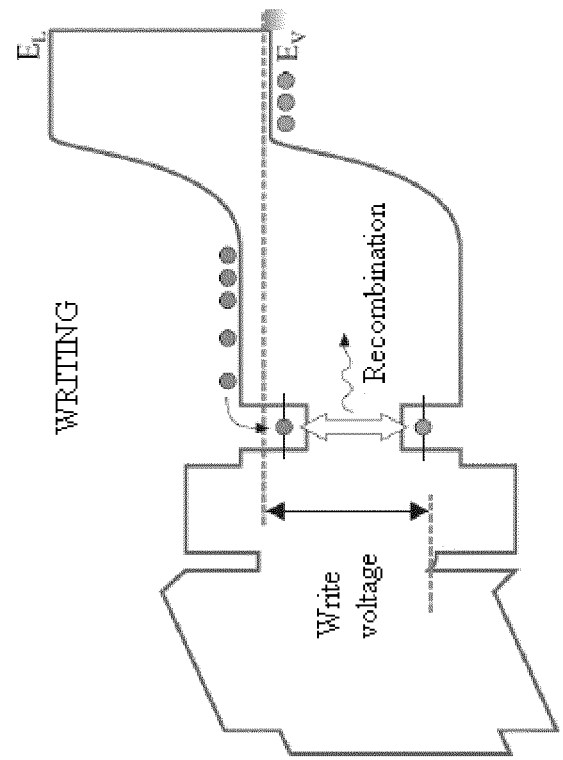
Figure 7:
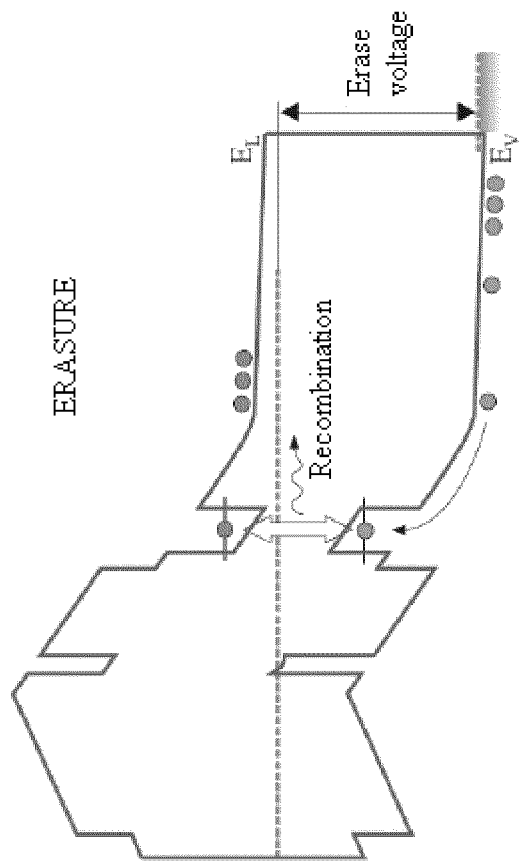
Figure 9:
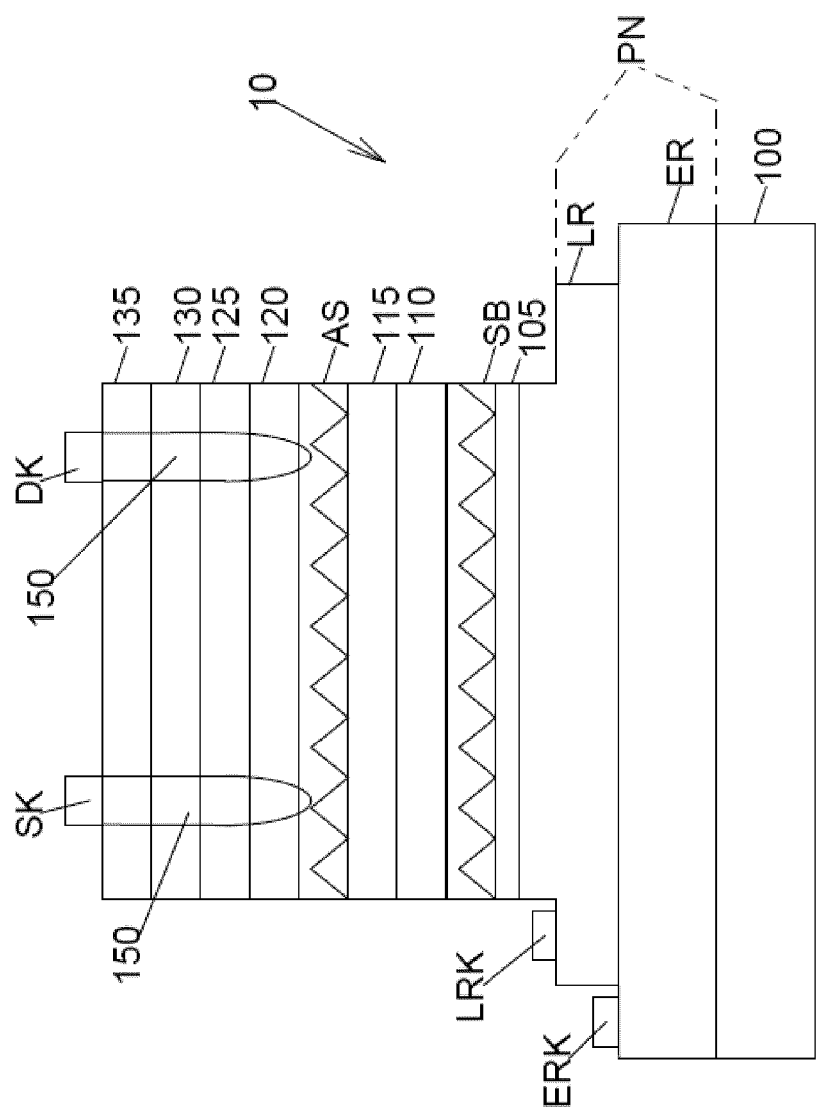
Figure 10:
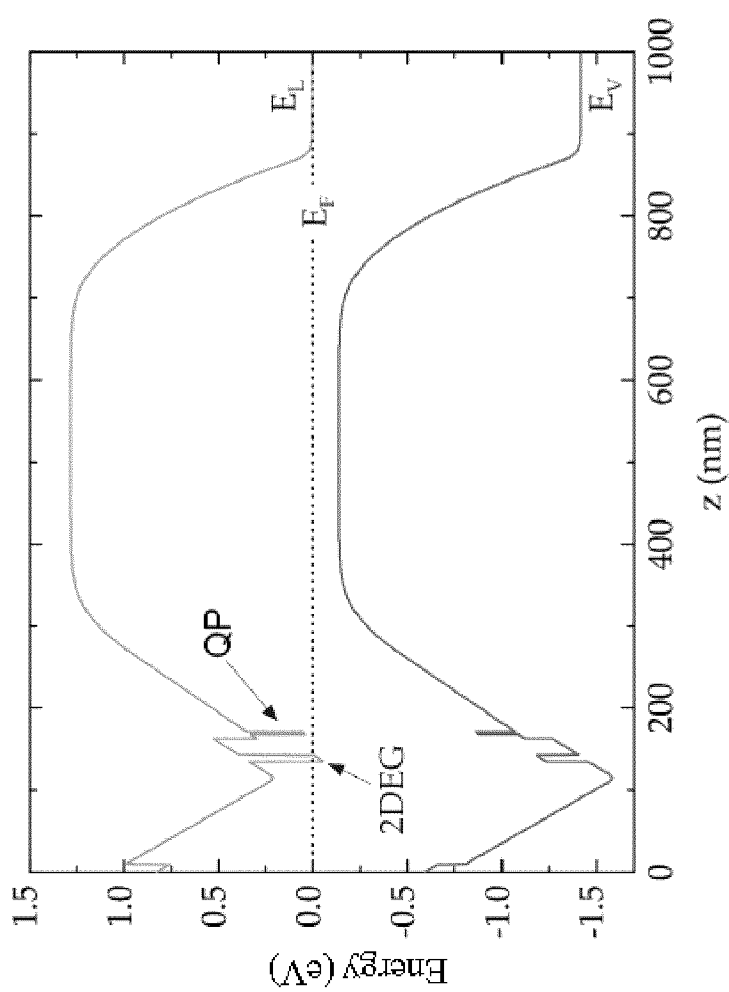

The invention is explained in greater detail below on the basis of exemplary embodiments; in this case, in the figures, by way of example:

FIG. 1 shows a first exemplary embodiment of a memory cell according to the invention in a schematic illustration with a two-dimensional hole gas layer, FIG. 2 shows a second exemplary embodiment of a memory cell according to the invention in a schematic illustration with a two-dimensional electron gas layer, FIG. 3 shows a third exemplary embodiment of a memory cell according to the invention in a detail illustration with a two-dimensional hole gas layer, FIG. 4 shows the calculated band profile in the case of the exemplary embodiment in accordance with FIG. 3, FIG. 5 shows the band profile and the band occupancy in the case of the exemplary embodiment in accordance with FIG. 3 in the case of electron storage, FIG. 6 shows the band profile and the band occupancy in the case of the exemplary embodiment in accordance with FIG. 3 in the case of hole storage, FIG. 7 shows the band profile and the band occupancy in the case of the exemplary embodiment in accordance with FIG. 3 during erasure, FIG. 8 shows the band profile and the band occupancy in the case of the exemplary embodiment in accordance with FIG. 3 during writing, FIG. 9 shows a fourth exemplary embodiment of a memory cell according to the invention in a detail illustration with a two-dimensional electron gas layer, and FIG. 10 shows the calculated band profile in the case of the exemplary embodiment in accordance with FIG. 9.

In the figures, the same reference signs are always used for identical or comparable components.

FIG. 1 reveals a first exemplary embodiment of a memory cell 10.

The layer structure of the memory cell 10 comprises four semiconductor sections, namely a hole reservoir LR, an electron reservoir ER, a memory area SB and a read-out layer AS. A p-doped semiconductor material is preferably employed as the hole reservoir LR and an n-doped semiconductor material is preferably employed as the electron reservoir ER. The hole reservoir LR and the electron reservoir ER jointly form a charge carrier injection device of the memory cell 10.

The memory area SB preferably comprises a semiconductor heterostructure, the band profile of which has at least one potential well. A strained double heterostructure is preferably employed, which leads to the formation of at least one self-assembled quantum dot [6]. As an alternative thereto, the memory area SB can consist of one or more quantum rings or a quantum film. Self-assembled quantum dots have the advantage, however, that high localization energies are achieved even in greatly strained heterostructures [7] and that the trapping cross section is significantly larger in comparison with defects, which leads to fast trapping times [8, 9].

The layers can be arranged for example in two different ways: the electron reservoir ER can adjoin the memory area SB, as is shown in FIG. 1. In this case, a two-dimensional hole gas layer is preferably used as the read-out layer AS.

If, by contrast, the hole reservoir LR adjoins the memory area SB, as is shown in FIG. 2, then a two-dimensional electron gas layer is preferably used as the read-out layer AS.

The binary memory states of the two memory cells shown in FIGS. 1 and 2 are realized by virtue of the fact that, for one binary memory state, the memory area SB is occupied by electrons and, for the other binary memory state, the memory area SB is occupied by holes. The change between the two binary memory states, that is to say the writing or the erasing of the information, is realized by means of an inversion of the occupancy of the memory area SB from hole storage to electron storage, or vice versa. For this purpose, a voltage pulse is preferably applied to the memory cell, which makes it possible for the charge carrier type complementary to the stored charge carrier type to pass into the memory area SB and recombine there preferably radiatively with the stored charge carriers. At the end of the write or erase pulse, the initially stored charge carrier type has been removed from the memory area SB by recombination and the memory area SB is now occupied by the charge carrier type complementary thereto.

The stored information can be read out for example by means of a current measurement (analogously to the conventional flash memory) in the read-out layer AS adjacent to the memory area SB. This is because the occupancy state of the memory area SB (electron or hole occupancy) changes the conductivity of the read-out layer AS on account of Coulomb's law and the proximity of the regions to one another and can thus easily be detected by means of a current measurement [4, 5].

FIG. 3 shows a third exemplary embodiment of a memory cell 10. A substrate 100 can be discerned, on which a hole reservoir LR in the form of a layer composed of, for example, p-doped GaAs (layer thickness preferably between 100 nm and 1000 nm, for example 600 nm; doping preferably between $1*10^{16}$ cm$^{-3}$ and $1*10^{19}$ cm$^{-3}$, for example $1*10^{18}$ cm$^{-3}$) is applied. An electron reservoir ER in the form of a layer composed of, for example, n-doped GaAs (layer thickness preferably between 100 nm and 1000 nm, for example 600 nm; doping preferably between $1*10^{15}$ cm$^{-3}$ and $1*10^{18}$ cm$^{-3}$, for example $5*10^{16}$ cm$^{-3}$) is situated in the hole reservoir LR.

An intermediate layer 105 composed of, for example, undoped GaAs (layer thickness preferably between 100 nm and 1000 nm, for example 100 nm) is arranged on the electron reservoir ER. The intermediate layer 105 separates the charge carrier injection device formed by the hole reservoir LR and the electron reservoir ER in the form of the pn diode PN from a lower side of a memory area, which is formed by a storage layer SB in the exemplary embodiment in accordance with FIG. 3.

The storage layer SB preferably comprises a quantum dot layer composed of In(Ga)As quantum dots.

The upper side of the storage layer SB is adjoined by a spacer layer 110 (material: e.g. GaAs; layer thickness preferably between 1 nm and 10 nm, for example 5 nm; doping preferably undoped), a barrier 115 (material: e.g. $Al_{0.3}Ga_{0.7}As$; layer thickness preferably between 10 nm and 100 nm, for example 20 nm; doping preferably undoped), and a read-out layer AS (e.g. quantum film composed of 1 nm to 10 nm (e.g. 8 nm) undoped $In_{0.25}Ga_{0.75}As$). The read-out layer AS is preferably a two-dimensional hole gas layer.

On the read-out layer AS there are preferably situated a further spacer layer 120 (material: e.g. $Al_{0.3}Ga_{0.7}As$; layer thickness preferably between 5 nm and 30 nm, for example 15 nm; doping preferably undoped), a doped layer 125 (material: e.g. p-doped $Al_{0.3}Ga_{0.7}As$; layer thickness preferably between 0 nm (δ doping) and 100 nm, for example 10 nm; doping between $1*10^{16}$ cm$^{-3}$ and $1*10^{20}$ cm$^{-3}$ e.g. $1*10^{18}$ cm$^{-3}$), an additional spacer layer 130 (material: e.g. $Al_{0.3}Ga_{0.7}As$; layer thickness preferably between 1 nm and 1000 nm, for example 100 nm; doping preferably undoped) and a cover layer 135 (material: e.g. undoped GaAs; layer thickness preferably between 1 nm and 100 nm, for example 10 nm).

The memory cell 10 is provided with four contacts, namely an ohmic rear contact LRK on the hole reservoir LR, an ohmic base contact ERK on the electron reservoir ER and ohmic source and drain contacts SK and DK, which make contact with the read-out layer AS. The source and drain contacts SK and DK are preferably connected to the buried read-out layer AS via doped contact regions 150.

The source and drain contacts SK and DK, the doped contact regions 150 and the buried read-out layer AS form a read-out device of the memory cell 10.

The band profile in the memory cell without an applied voltage is shown by way of example in FIG. 4. The band profile was calculated from the layer structure using a so-called Poisson solver. In FIG. 4, the quantum dots are designated by the reference sign QP and the two-dimensional hole gas layer is designated by the reference sign 2DHG.

The memory operations of the memory cell 10 in accordance with FIG. 3 are explained in greater detail below; in this case, reference is made to FIGS. 5 to 8.

Storage Operation:

For storing the two binary memory states, no voltage is present at the memory cell. The band profile during storage is shown schematically in a simplified manner for the case of electron storage in FIG. 5 and for the case of hole storage in FIG. 6.

The localization energy Elok of the electrons or holes in the quantum dots of the storage layer SB constitutes an emission barrier for the stored electrons or holes, which ensures the permanent storage thereof in the quantum dots.

In the case of electron storage, the band bending of the n-p junction prevents holes from being able to pass from the rear contact into the quantum dots and from recombining with the stored electrons. In the case of hole storage, the trapping barrier formed below the quantum dots suppresses the trapping of electrons into the quantum dots. Consequently, localization energy Elok and trapping barrier ensure the permanent maintenance of the two binary states (electron and hole storage) without the supply of energy and without voltage.

Erasure Operation:

Erasure can be defined as, for example, the changeover from electron storage to hole storage. However, this definition is arbitrary and can also be implemented oppositely.

The starting point is electron storage, for example, as is shown in FIG. 5. Between the base contact and the rear contact an erase voltage in the forward direction of the magnitude of the diffusion voltage is applied, which leads to the reduction of the n-p space charge zone. The holes from the hole reservoir diffuse or drift into the n-doped region and further into the quantum dots, in order to recombine there with the stored electrons (cf. FIG. 7). Although a recombination with the electrons also takes place in the n-doped region, the layer thickness of the n-doped electron reservoir is preferably chosen to be small compared with the diffusion length of the holes, such that proportionally only few holes recombine in this region. In this case, the barrier above the quantum dot layer increases the trapping of holes into the quantum dots since it prevents the holes from diffusing across the quantum dot layer right into the read-out layer. At the end of the erasure operation (erase pulse), holes remain stored in the quantum dots as majority charge. The occupancy of the quantum dots has thus been inverted from electron to hole storage (cf. FIG. 6).

Writing Operation:

The starting point here is hole storage, as is shown by way of example in FIG. 6. It can be seen that the quantum dots are occupied by holes. Between the source contact and the drain contact, on the one hand, and the base contact, on the other hand, for the purpose of writing a write voltage in the forward direction of the magnitude of the diffusion voltage is applied, which leads to the reduction of the band bending and thus of the trapping barrier for the electrons. The electrons then relax directly from the band edge into the quantum dots and recombine there with the stored holes (cf. FIG. 8). Since, on account of the trapping barrier between electron reservoir and hole reservoir, no holes can subsequently flow from the hole reservoir, excess electrons remain stored in the quantum dot after recombination (cf. FIG. 5).

FIG. 9 shows a fourth exemplary embodiment of a memory cell 10. The fourth exemplary embodiment corresponds to the third exemplary embodiment; the doping of the layer sequence is merely inverted, and for read-out a two-dimensional electron gas layer is used instead of a two-dimensional hole gas layer.

A substrate 100 can be discerned, on which an electron reservoir ER in the form of an n-doped layer is applied. A hole reservoir LR in the form of a p-doped layer is situated on the electron reservoir ER. An undoped intermediate layer 105 is arranged on the hole reservoir LR; the intermediate layer separates the pn diode PN formed by the hole reservoir LR and the electron reservoir ER from a lower side of a memory area in the form of a storage layer SB. The storage layer SB preferably comprises a quantum dot layer composed of In(Ga)As quantum dots.

The upper side of the storage layer SB is adjoined by an undoped spacer layer 110, a barrier 115 and a read-out layer AS. The read-out layer AS is preferably a two-dimensional electron gas layer.

On the read-out layer AS there are preferably situated a further undoped spacer layer 120, an n-doped layer 125, an additional undoped spacer layer 130 and an undoped cover layer 135.

The memory cell 10 is provided with four contacts, namely an ohmic rear contact ERK on the electron reservoir ER, an ohmic base contact LRK on the hole reservoir LR and ohmic source and drain contacts SK and DK, which make contact with the read-out layer AS. The source and drain contacts SK and DK are preferably connected to the buried read-out layer AS via doped contact regions 150.

The band profile in the memory cell without an applied voltage is shown by way of example in FIG. 10. The band profile was calculated from the layer structure using a so-called Poisson solver. In FIG. 10, the quantum dots are designated by the reference sign QP and the two-dimensional electron gas layer is designated by the reference sign 2DEG.

The memory cells such as have been described above by way of example in association with FIGS. 1-10 can have one or more of the following advantages:

- Erasure takes place as a result of recombination of the charge carriers in the storage layer.
- Independently of the storage time it is possible to realize fast write and erase times in the range of the recombination time of the charge carriers (e.g. for quantum dots in the range of 1 nanosecond) [10].
- A compromise between long storage time and fast erase and write time is no longer necessary.
- Only voltages which are in the range of the diffusion voltage of the p-n junctions are applied to the memory cell for the purpose of writing and erasing. It is thus possible to realize write and erase voltages of less than 2V, which results in a low power consumption and is in the range of the core voltage of customary processors.
- In contrast to flash memories, high electric fields that lead to the known low durability of the flash memory are not built up for the purpose of writing and erasing.
- The durability of the memory cells described here will be in the range of the durability of conventional DRAM memories on account of the low electric fields during writing and erasing.

LITERATURE

[1] International Technology Roadmap for Semiconductors, Emerging Research Devices, Technical report, Edition 2009.

[2] R. Waser, Nanoelectronics and Information Technology, Wiley-VCH, Berlin, 2003.
[3] P. Pavan, R. Bez, P. Olivo, and E. Zanoni, Flash memory cells—An overview, Proc. IEEE 85(8), 1248-1271 (1997).
[4] B. Marquardt, M. Geller, A. Lorke, D. Reuter, and A. D. Wieck, Using a two-dimensional electron gas to study nonequilibrium tunneling dynamics and charge storage in selfassembled quantum dots, Appl. Phys. Lett. 95(2), 022113 (2009).
[5] M. Russ, C. Meier, A. Lorke, D. Reuter, and A. D. Wieck, Role of quantum capacitance in coupled lowdimensional electron systems, Phys. Rev. B 73(11), 115334 (2006).
[6] D. Bimberg, Semiconductor Nanostructures, Springer-Verlag, Berlin Heidelberg, 2008.
[7] A. Marent, M. Geller, A. Schliwa, D. Feise, K. Pötschke, D. Bimberg, N. Akcay, and N. Oncan, $10^6$ years extrapolated hole storage time in GaSb/AlAs quantum dots, Appl. Phys. Lett. 91(24), 242109 (2007).
[8] M. Geller, A. Marent, E. Stock, D. Bimberg, V. I. Zubkov, I. S. Shulgunova, and A. V. Solomonov, Hole capture into self-organized InGaAs quantum dots, Appl. Phys. Lett. 89(23), 232105 (2006).
[9] M. Geller, A. Marent, T. Nowozin, D. Bimberg, N. Akcay, and N. Oncan, A write time of 6 ns for quantum dot-based memory structures, Appl. Phys. Lett. 92(9), 092108 (2008).
[10] M. Feucker, R. Seguin, S. Rodt, A. Hoffmann, and D. Bimberg, Decay dynamics of neutral and charged excitonic complexes in single InAs/GaAs quantum dots, Appl. Phys. Lett. 92(6), 063116 (2008).

LIST OF REFERENCE SIGNS

AS Read-out layer
DK Contact
$E_F$ Fermi energy
$E_L$ Conduction band
$E_{Lok}$ Localization energy
ER Electron reservoir
ERK Contact
$E_V$ Valence band
LR Hole reservoir
LRK Contact
PN pn diode
QP Quantum dot
SB Memory area/storage layer
SK Contact
2DEG Two-dimensional electron gas layer
2DHG Two-dimensional hole gas layer
10 Memory cell
100 Substrate
105 Intermediate layer
110 Spacer layer
115 Barrier
120 Spacer layer
125 Layer
130 Spacer layer
135 Cover layer
150 Contact region

The invention claimed is:

1. A memory cell comprising at least one binary memory area for storing bit information, wherein
the memory area can optionally store holes or electrons and allows a recombination of holes and electrons,
the charge carrier type of the charge carriers stored in the memory area defines the bit information of the memory area, and
a charge carrier injection device is present, by means of which optionally holes or electrons can be injected into the memory area and the bit information can thus be changed;
wherein
the memory cell is configured in such a way that the stored bit information is changed by virtue of the fact that
in the case where holes are stored in the memory area, electrons are injected by virtue of the fact that between a source contact and a drain contact of the memory cell, on the one hand, and the base contact of the memory cell, on the other hand, for writing purposes a write voltage in the forward direction of at least the magnitude of a diffusion voltage is applied, which leads to the reduction of a band bending and thus of the trapping barrier for the electrons, such that the electrons relax directly from the band edge into the memory area and recombine there with the stored holes and the bit information is overwritten with excess electrons, and
in the case where electrons are stored in the memory area, between the base contact and the rear contact an erase voltage in the forward direction of at least the magnitude of the diffusion voltage is applied, which leads to the reduction of the p-n space charge zone and holes are thus injected, which diffuse and/or drift from a hole reservoir of the charge carrier injection device into an n-doped region of the charge carrier injection device and further into the memory area in order to recombine there with the stored electrons, and the bit information is changed with excess holes, or
the memory cell is configured in such a way that the stored bit information is changed by virtue of the fact that
in the case where holes are stored in the memory area, between the base contact and the rear contact an erase voltage in the forward direction of at least the magnitude of the diffusion voltage is applied, which leads to the reduction of the p-n space charge zone and electrons are thus injected, which diffuse and/or drift from an electron reservoir of the charge carrier injection device into a p-doped region of the charge carrier injection device and further into the memory area in order to recombine there with the stored holes, and the bit information is changed with excess electrons, and
in the case where electrons are stored in the memory area, holes are injected by virtue of the fact that between a source contact and a drain contact of the memory cell, on the one hand, and the base contact of the memory cell, on the other hand, for writing purposes a write voltage in the forward direction of at least the magnitude of a diffusion voltage is applied, which leads to the reduction of a band bending and thus of the trapping barrier for the holes, such that the holes relax directly from the band edge into the memory area and recombine there with the stored electrons and the bit information is overwritten with excess holes.

2. The memory cell as claimed in claim 1, wherein
the charge carrier injection device indirectly or directly adjoins one side of the memory area, and
a read-out device is arranged at the opposite other side, by means of which read-out device the charge carrier type stored in the memory area can be read out.

3. The memory cell as claimed in claim 1, wherein
the memory area comprises a double heterostructure, and the charge carrier injection device has a p-doped section and an n-doped section, which indirectly or directly adjoin the same side of the double heterostructure, such that, depending on external electrical driving, the n-doped section can inject electrons or the p-doped section can inject holes from the same side into the double heterostructure.

4. The memory cell as claimed in claim 1, wherein a read-out device having an electrically conductive section is present, the conductivity of said section depending on the charge carrier type stored in the memory area.

5. The memory cell as claimed in claim 4, wherein the read-out device comprises a two-dimensional hole gas layer or a two-dimensional electron gas layer.

6. A memory cell comprising at least one binary memory area for storing bit information, wherein
the memory area can optionally store holes or electrons and allows a recombination of holes and electrons,
the charge carrier type of the charge carriers stored in the memory area defines the bit information of the memory area, and
a charge carrier injection device is present, by means of which optionally holes or electrons can be injected into the memory area and the bit information can thus be changed;
wherein the memory area has a direct band transition which enables a radiative recombination of electrons and holes during the overwriting of the bit information.

7. A memory cell comprising at least one binary memory area for storing bit information, wherein
the memory area can optionally store holes or electrons and allows a recombination of holes and electrons,
the charge carrier type of the charge carriers stored in the memory area defines the bit information of the memory area, and
a charge carrier injection device is present, by means of which optionally holes or electrons can be injected into the memory area and the bit information can thus be changed;
wherein
the memory area comprises undoped semiconductor material, on one side of the memory area there is adjacent an n-doped semiconductor material followed by a p-doped semiconductor material, and on the other side of the memory area there is adjacent a read-out layer in the form of a two-dimensional hole gas layer, or
the memory area comprises undoped semiconductor material, on one side of the memory area there is adjacent a p-doped semiconductor material followed by an n-doped semiconductor material, and on the other side of the memory area there is adjacent a read-out layer in the form of a two-dimensional electron gas layer.

8. A method for storing bit information in a binary memory area, wherein
holes or electrons are stored in the memory area depending on the bit information to be stored, wherein the charge carrier type of the charge carriers stored in the memory area defines the bit information of the memory cell, and
in order to change the bit information respectively stored, the charge carriers stored in the memory area are removed by virtue of the fact that complementary charge carriers are injected, which recombine with the stored charge carriers, and
the new bit information is brought about by further complementary charge carriers being stored in the memory area;
wherein
the stored bit information is changed by virtue of the fact that
in the case where holes are stored in the memory area, electrons are injected by virtue of the fact that between a source contact and a drain contact of the memory cell, on the one hand, and the base contact of the memory cell, on the other hand, for writing purposes a write voltage in the forward direction of at least the magnitude of a diffusion voltage is applied, which leads to the reduction of a band bending and thus of the trapping barrier for the electrons, such that the electrons relax directly from the band edge into the memory area and recombine there with the stored holes and the bit information is overwritten with excess electrons, and
in the case where electrons are stored in the memory area, between the base contact and the rear contact an erase voltage in the forward direction of at least the magnitude of the diffusion voltage is applied, which leads to the reduction of the p-n space charge zone and holes are thus injected, which diffuse and/or drift from a hole reservoir of the charge carrier injection device into an n-doped region of the charge carrier injection device and further into the memory area in order to recombine there with the stored electrons, and the bit information is changed with excess holes, or
the stored bit information is changed by virtue of the fact that
in the case where holes are stored in the memory area, between the base contact and the rear contact an erase voltage in the forward direction of at least the magnitude of the diffusion voltage is applied, which leads to the reduction of the p-n space charge zone and electrons are thus injected, which diffuse and/or drift from an electron reservoir of the charge carrier injection device into a p-doped region of the charge carrier injection device and further into the memory area in order to recombine there with the stored holes, and the bit information is changed with excess electrons, and
in the case where electrons are stored in the memory area, holes are injected by virtue of the fact that between a source contact and a drain contact of the memory cell, on the one hand, and the base contact of the memory cell, on the other hand, for writing purposes a write voltage in the forward direction of at least the magnitude of a diffusion voltage is applied, which leads to the reduction of a band bending and thus of the trapping barrier for the holes, such that the holes relax directly from the band edge into the memory area and recombine there with the stored electrons and the bit information is overwritten with excess holes.

9. The method as claimed in claim 8,
wherein the charge carriers are injected at one side of the memory area, and
the bit information stored in the memory area is read out at the opposite other side.

* * * * *